(12) United States Patent
Klebanov et al.

(10) Patent No.: US 10,056,364 B1
(45) Date of Patent: Aug. 21, 2018

(54) ELECTRONIC DEVICE WITH ADJUSTABLE REVERSE BREAKDOWN VOLTAGE

(71) Applicant: Allegro MicroSystems, LLC, Worcester, MA (US)

(72) Inventors: Maxim Klebanov, Newton, MA (US); Washington Lamar, Mont Vernon, NH (US); Richard B. Cooper, Shrewsbury, MA (US); Chung C. Kuo, West Boylston, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/481,882

(22) Filed: Apr. 7, 2017

(51) Int. Cl.
| | |
|---|---|
| *H01L 29/66* | (2006.01) |
| *H01L 27/02* | (2006.01) |
| *H01L 29/40* | (2006.01) |
| *H01L 29/866* | (2006.01) |
| *H01L 29/739* | (2006.01) |

(52) U.S. Cl.
CPC ........ *H01L 27/0255* (2013.01); *H01L 29/402* (2013.01); *H01L 29/7392* (2013.01); *H01L 29/866* (2013.01)

(58) Field of Classification Search
CPC ............... H01L 27/0255; H01L 29/402; H01L 29/7392; H01L 29/866
USPC .......................................................... 257/175
See application file for complete search history.

(56) References Cited

U.S. PATENT DOCUMENTS

| | | | |
|---|---|---|---|
| 5,602,046 A * | 2/1997 | Calafut ............... | H01L 27/0251 148/DIG. 126 |
| 7,466,004 B2 | 12/2008 | Kosier et al. | |
| 9,698,742 B2 | 7/2017 | Chaware et al. | |
| 2002/0084485 A1 * | 7/2002 | Jun ................. | H01L 21/823481 257/328 |

OTHER PUBLICATIONS

U.S. Appl. No. 15/272,784, filed Sep. 22, 2016, Lamar et al.

* cited by examiner

*Primary Examiner* — Tu-Tu Ho
(74) *Attorney, Agent, or Firm* — Daly Crowley Mofford & Durkee LLP

(57) ABSTRACT

An electrical device may include a substrate; a first doped region of the substrate having a p doping type; a second doped region adjacent to the first doped region of the substrate having an n doping type, wherein an interface between the first and second doped regions forms a p-n junction; and a circuit element placed in spaced relation to the p-n junction, the circuit element configured to produce an electric field that interacts with the p-n junction to change a reverse breakdown voltage of the p-n junction. Applicants for the electrical device include ESD protection circuits.

14 Claims, 10 Drawing Sheets

ELECTRONIC DEVICE WITH ADJUSTABLE REVERSE BREAKDOWN VOLTAGE

FIELD

This disclosure relates to electronic device with breakdown voltages and, in particular, to electronic device with adjustable breakdown voltages.

BACKGROUND

Diodes allow current to flow in one direction. However, if a high enough reverse voltage is applied to a diode, the diode will allow current to flow in the opposite direction through the diode. The voltage required to drive current though the diode in the reverse direction is referred to as the reverse breakdown voltage, or simply the breakdown voltage. Some diodes, such as Zener diodes, have relatively low breakdown voltages that are utilized in various circuit designs. For example, electrostatic discharge (ESD) protection circuits may utilize Zener diodes to block current from flowing under normal voltage conditions, and to allow current to flow through the diode in the reverse direction under high voltage conditions.

SUMMARY

In an embodiment, an apparatus includes: a substrate; a first doped region of the substrate having a p doping type; a second doped region adjacent to the first doped region of the substrate having an n doping type, wherein an interface between the first and second doped regions forms a p-n junction; and a circuit element placed in spaced relation to the p-n junction, the circuit element configured to produce an electric field that interacts with the p-n junction to change a reverse breakdown voltage of the p-n junction.

In another embodiment, an apparatus includes a substrate; a Zener diode formed in the substrate with an adjustable reverse breakdown voltage, the Zener diode comprising: a first doped region of the substrate having a first doping type; a second doped region having a second doping type positioned adjacent to the first doped region of the substrate, wherein an interface between the first and second doped regions forms a p-n junction; a field plate placed in spaced relation to the p-n junction, the field plate configured to produce an electric field that interacts with the p-n junction to change a reverse breakdown voltage of the p-n junction; and a biasing circuit to generate a voltage on the field plate to generate the electric field.

In another embodiment, an ESD protection circuit includes: a first terminal; a second terminal; an adjustable Zener diode coupled in series between the first and second terminals, the adjustable Zener diode having an anode, a cathode, and a control input node, wherein a voltage applied to the control input node alters a reverse breakdown voltage of the Zener diode.

In another embodiment, an ESD protection circuit includes: an ESD clamp circuit comprising an npn transistor; and an adjustable Zener diode having an adjustable reverse breakdown voltage and a control input node configured to receive a voltage that adjusts the reverse breakdown voltage; wherein control of the input node of the adjustable Zener diode is coupled to one of the two collectors of the npn transistor. The npn-transistor may be a two-collector npn transistor.

In another embodiment, an integrated circuit includes a substrate; and a test circuit comprising: a Zener diode formed in the substrate with an adjustable reverse breakdown voltage. The Zener diode includes a first doped region of the substrate having a p doping type; a second doped region having an n doping type positioned adjacent to the first doped region of the substrate, wherein an interface between the first and second doped regions forms a p-n junction; a field plate placed in spaced relation to the p-n junction, the field plate configured to produce an electric field that interacts with the p-n junction to change a reverse breakdown voltage of the p-n junction; and a biasing circuit to generate a voltage on the field plate to generate the electric field; wherein the Zener diode is coupled in parallel with a protected circuit and configured to protect the protected circuit from overstress conditions; and wherein the biasing circuit is configured to generate a first voltage during normal operation of the integrated circuit and a second voltage during testing of the integrated circuit.

In another embodiment, an apparatus includes a first terminal; a second terminal; one or more conduction path circuits coupled between the first and second terminals, each conduction path circuit comprising a Zener diode with an adjustable reverse breakdown voltage, each Zener diode comprising a control input node to receive an analog voltage that controls the adjustable reverse breakdown voltage; wherein the conduction path circuit includes an input terminal to receive an enable signal which, when activated, allows the conduction path circuit to conduct electrical current between the first and second terminals; and a control circuit coupled to the control input nodes of the Zener diodes of the one or more conduction path circuits, the control circuit configured to generate the analog voltage and selectively control the adjustable reverse breakdown voltage of the Zener diodes to control current flow through the one or more conduction path circuits.

In another embodiment, an apparatus comprises: a substrate; a first doped region of the semiconductor substrate having a p doping type; a second doped region adjacent to the first doped region of the semiconductor substrate having an n doping type, wherein an interface between the first and second doped regions forms a p-n junction; and means for producing an electric field that interacts with the p-n junction to change a reverse breakdown voltage of the p-n junction.

In another embodiment, an ESD protection circuit comprises: a first terminal; a second terminal; a Zener diode coupled in series between the first and second terminals, the Zener diode comprising means for adjusting a breakdown voltage of the Zener diode; and circuit means for adjusting the breakdown voltage during operation of the ESD protection circuit.

Additional embodiments may fall within the scope of this disclosure and the claims.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like reference numbers in the figures denote like elements.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 1:
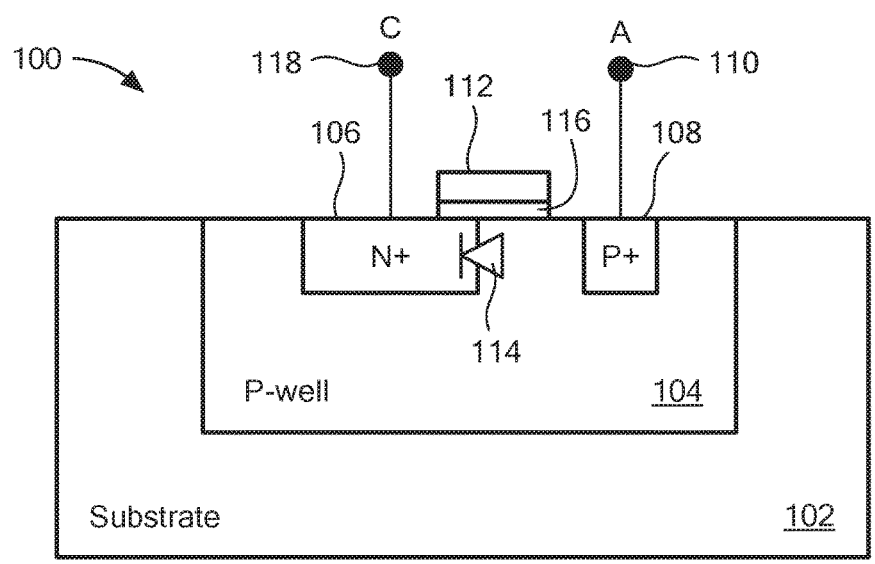
FIG. 1 is a cross-sectional view of an integrated circuit supporting an electronic device with an adjustable reverse breakdown voltage.

FIG. 1 is a cross sectional diagram of an integrated circuit supporting an electronic device 100 with adjustable turn-on voltage. In an embodiment, electronic device 100 may be a Zener, avalanche, or other type of diode. For ease of explanation, this disclosure discusses Zener diode. However, one skilled in the art will recognize that other types of diodes or devices may be used in place of Zener diodes as appropriate.

Electronic device 100 may include a substrate 102, which may comprise a material that can support integrated circuits. In embodiments, the substrate may comprise a semiconductor material such as silicon, germanium, gallium arsenide, or any other type of semiconductor material. In other embodiments, substrate 102 may comprise a glass or ceramic material that can support integrated circuits.

Substrate 102 may include a p-doped well ("p-well") 104. An n-doped region 106 may be formed within p-well 104. Additionally, a p-doped region 108 may also be formed within p-well 104. P-doped region 108 may provide a low resistive contact to terminal 110. In embodiments, p-doped region 108 may be more strongly doped than p-well 104.

For ease of illustration, well 104 is described as p-doped, region 106 is described as n-doped, and region 108 is described as p-doped. However, one skilled in the art will recognize that the doping of these regions can be reversed to obtain similar or opposite characteristics of electronic device 100. For example, if the doping polarity is reversed, the resulting device may be a Zener diode with a negative breakdown voltage that breaks down when an applied voltage is less than the negative breakdown voltage.

Electronic device 100 may include field plate 112 placed adjacent to PN junction 114 between n-doped region 106 and p-well 104. A dielectric layer 116 may be positioned between field plate 112 and substrate 102 to galvanically isolate field plate 112 from substrate 102 and the doped regions.

PN junction 114 may act as a diode where terminal 110 (coupled to p-doped region 108) is the anode and terminal 118 (coupled to n-doped-region 106) is the cathode. When the diode is forward biased, current may flow from anode terminal 110, into p-doped region 108, into p-well 104, into n-doped region 106, and finally to cathode terminal 118.

In an embodiment, electronic device 100 may be constructed as a Zener diode. Accordingly, when the Zener diode is reverse biased with a voltage that exceeds the Zener diode's breakdown voltage, current may flow from cathode terminal 118 to n-doped region 106, to p-well 104, to p-doped region 108, and finally to anode terminal 110.

If a voltage is applied to field plate 112, it may create an electrostatic field that can change the reverse breakdown voltage of PN junction 114. For example, the electrostatic field may modulate the surface concentration of free carriers in the region of the PN junction that the field plate overlaps. A positive bias voltage applied to field plate 112 (with respect to anode terminal 110) may repel holes from the surface of p-well region 104, pushing them deeper into the bulk of p-well region 104 towards substrate 102. This may effectively lower the doping concentration of p-well 104 near PN junction 114, and thus increase the breakdown voltage of PN junction 114. Conversely, a negative bias voltage (with respect to anode terminal 110) may attract additional holes, effectively increasing the doping concentration of p-well 104 near PN junction 114. This may cause a decrease in the breakdown voltage of PN junction 114.

Figure 2A:
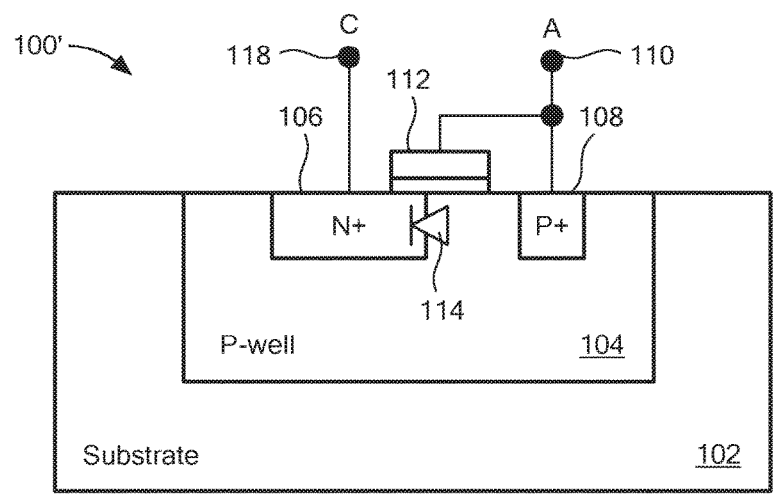
FIG. 2A is a cross-sectional view of another embodiment of an integrated circuit supporting an electronic device with an adjustable reverse breakdown voltage.

Referring to FIG. 2A, electronic device 100' may be the same as or similar to electronic device 100 of FIG. 1. In FIG. 2A, field plate 112 may be coupled to anode terminal 110. In a situation where electronic device 100' is reverse biased, this coupling may effectively lower the bias voltage of field plate 112 with respect to the voltage on anode terminal 110, and thus decrease the reverse breakdown voltage of PN junction 114, as described above.

Figure 2B:
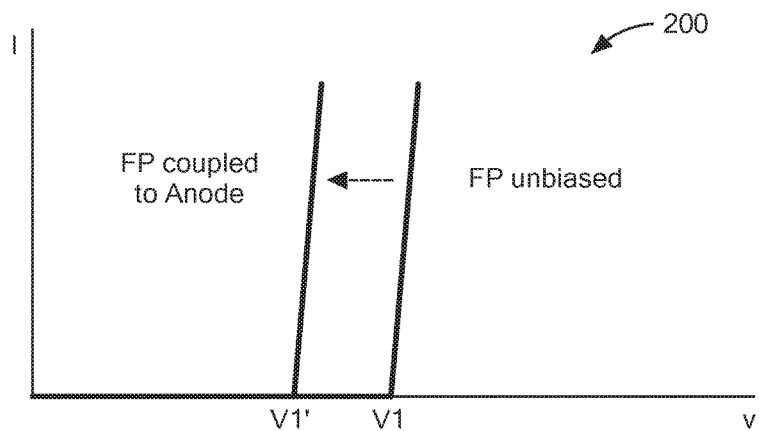
FIG. 2B is a graph of a current-voltage ("IV") curve of an electronic device with an adjustable reverse breakdown voltage.

FIG. 2B is an IV curve that illustrates the change in the reverse breakdown voltage. The horizontal axis represents the voltage from anode terminal 110 to cathode terminal 118, and the vertical axis represents the current through electronic device 110'. If field plate 112 remains unbiased (as shown in FIG. 1), the reverse breakdown voltage may be V1. If the voltage on field plate 112 is reduced (for example by coupling field plate 112 to anode terminal 110 as shown in FIG. 2A), then the reverse breakdown voltage may decrease to V1'.

Figure 3A:
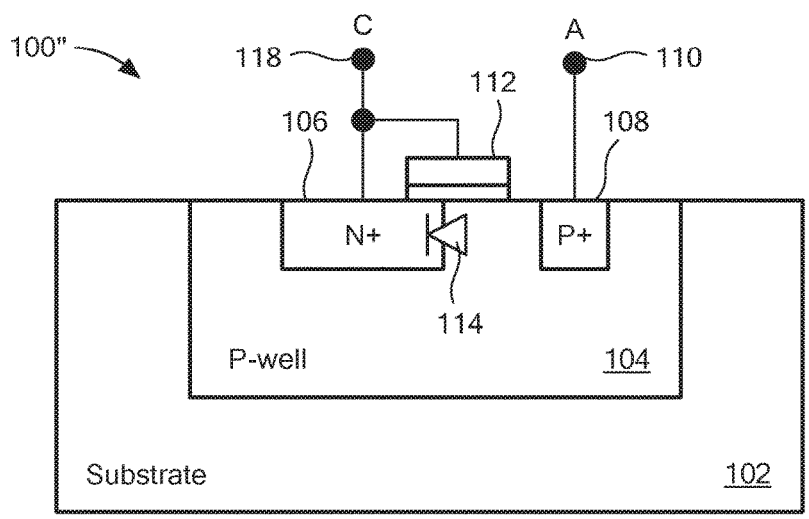
FIG. 3A is a cross-sectional view of another embodiment of an integrated circuit supporting an electronic device with an adjustable reverse breakdown voltage.

Referring to FIG. 3A, electronic device 100" may be the same as or similar to electronic device 100 of FIG. 1. In FIG. 3A, field plate 112 may be coupled to cathode terminal 118. In a situation where electronic device 100" is reverse biased, this coupling may effectively raise the bias voltage of field plate 112 with respect to the voltage on anode terminal 110, and thus increase the reverse breakdown voltage of PN junction 114, as described above.

Figure 3B:
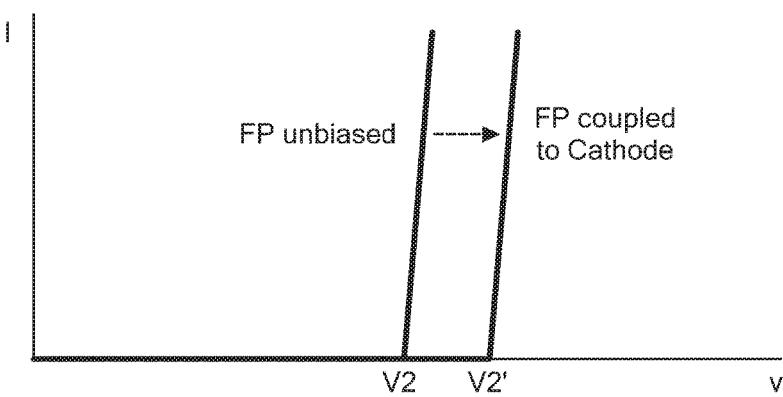
FIG. 3B is a graph of a current-voltage ("IV") curve of an electronic device with an adjustable reverse breakdown voltage.

FIG. 3B is an IV curve that illustrates the change in the reverse breakdown voltage. The horizontal axis represents the voltage from anode terminal 110 to cathode terminal 118, and the vertical axis represents the current through electronic device 110". If field plate 112 remains unbiased (as shown in FIG. 1), the reverse breakdown voltage may be V2. If the voltage on field plate 112 is increased with respect to the voltage on anode terminal 110 (for example by coupling field plate 112 to anode cathode terminal 118 as shown in FIG. 3A), then the reverse breakdown voltage may increase to V2'.

Figure 4:
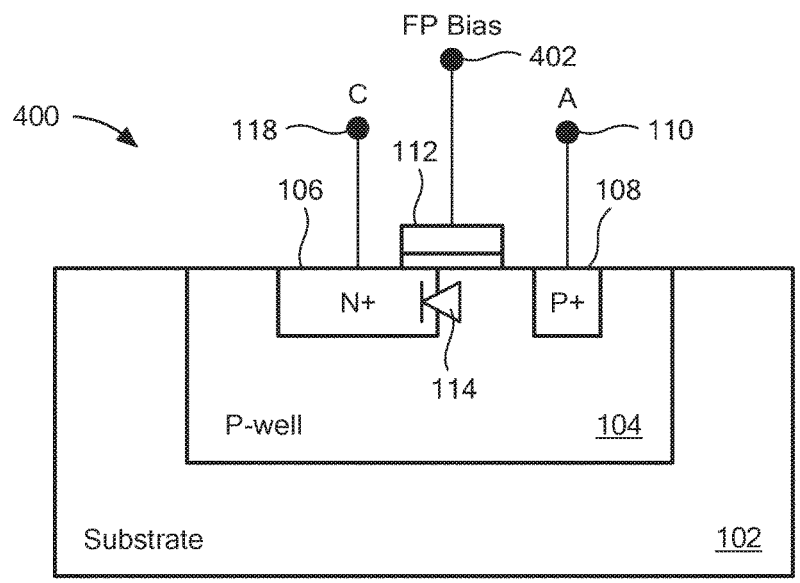
FIG. 4 is a cross-sectional view of another embodiment of an integrated circuit supporting an electronic device with an adjustable reverse breakdown voltage.

Referring now to FIG. 4, electronic device 400 includes field plate 112, which may be coupled to terminal 402. In embodiments, terminal 402 may be coupled to external circuitry that controls a voltage applied to field plate 112, and thus can control the value of the reverse breakdown voltage of PN junction 114.

Figure 5:
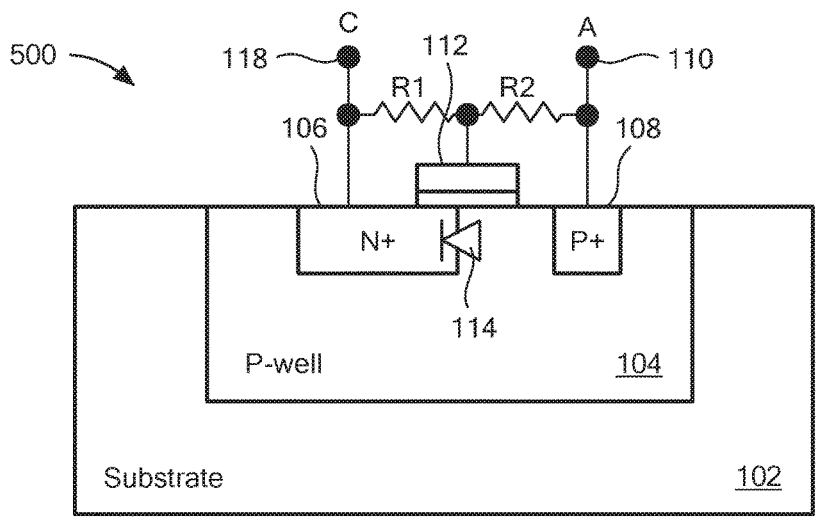
FIG. 5 is a cross-sectional view of another embodiment of an integrated circuit supporting an electronic device with an adjustable reverse breakdown voltage.

Referring to FIG. 5, electronic device 500 may be the same as or similar to electronic device 400. Electronic device 500 may include additional circuitry to control the bias voltage applied to field plate 112, and thus control the reverse breakdown voltage of PN junction 114. As shown in FIG. 5, the additional circuitry may be as resistor divider circuit comprising resistor R1 and resistor R2. Resistors R1 and R2 may be chosen to bias the voltage on field plate 112 toward the voltage on anode terminal 110 or toward the voltage on cathode terminal 118. As noted above, biasing the voltage on field plate 112 toward the voltage on anode terminal 110 may reduce the value of the breakdown voltage of PN junction 114, and biasing the voltage on field plate 112 toward the voltage on cathode terminal 118 may increase the value of the breakdown voltage of PN junction 114.

Figure 6:
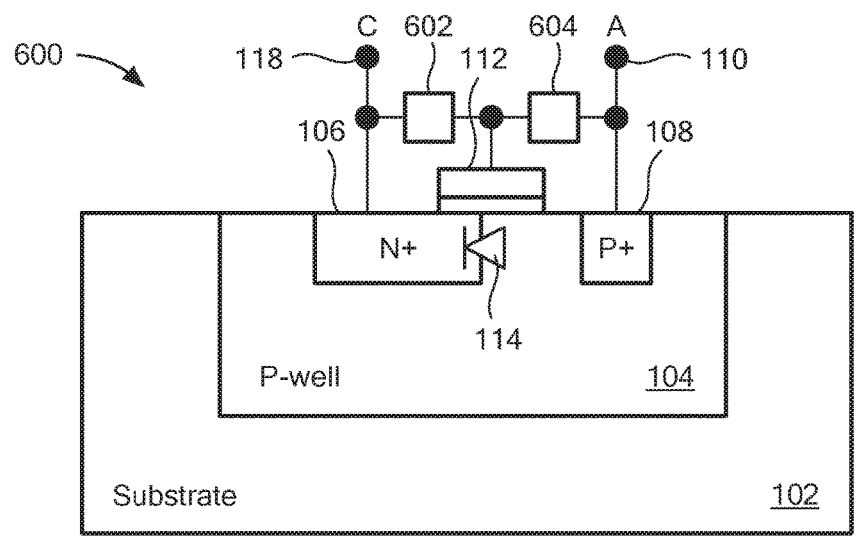
FIG. 6 is a cross-sectional view of another embodiment of an integrated circuit supporting an electronic device with an adjustable reverse breakdown voltage.

Referring to FIG. 6, electronic device 600 may be the same as or similar to electronic device 400. Electronic device 600 may include a circuit (shown by circuit elements 602 and 604) to control the voltage applied to field plate 112. In embodiments, circuits 602 and 604 may include reactive elements like capacitors or inductors, and/or active elements like transistors or diodes, or more complex circuits. Circuits 602 and 604 may implement a function that controls the voltage on field plate 112. The function may be a function of frequency, current, voltage, etc., and may dynamically alter the breakdown voltage of PN junction 114 while under operation.

Figure 7:
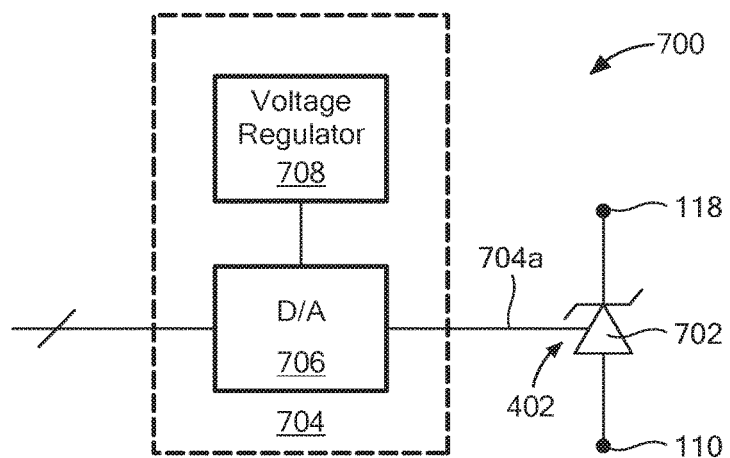
FIG. 7 is a circuit diagram of a circuit utilizing a Zener diode with an adjustable reverse breakdown voltage.

Referring to FIG. 7, circuit 700 may utilize a Zener diode 702 with an adjustable reverse breakdown voltage. Zener diode 702 may be the same as or similar to electronic device 400 described above. As shown, Zener diode 702 may include cathode terminal 118, anode terminal 110, and field plate terminal 402.

In embodiments, terminal 402 may be coupled to an external circuit 704 that controls the voltage at terminal 402, and thus controls the value of the reverse breakdown voltage of Zener diode 702. In embodiments, signal 704a produced by external circuit 704 may be an analog signal. As shown in FIG. 7, signal 704a may be produced by a digital-to-analog converter ("DAC") 706, powered by voltage regulator 708. Of course, other circuits may be coupled to terminal 402. Circuit 700 is simply an example of a circuit for controlling the reverse breakdown voltage of Zener diode 702. Other applications include a reference Zener diode for a voltage regulator, adjustable programmable references, adjustable breakdown voltage blocking diode for IC testing, etc.

Figure 8:
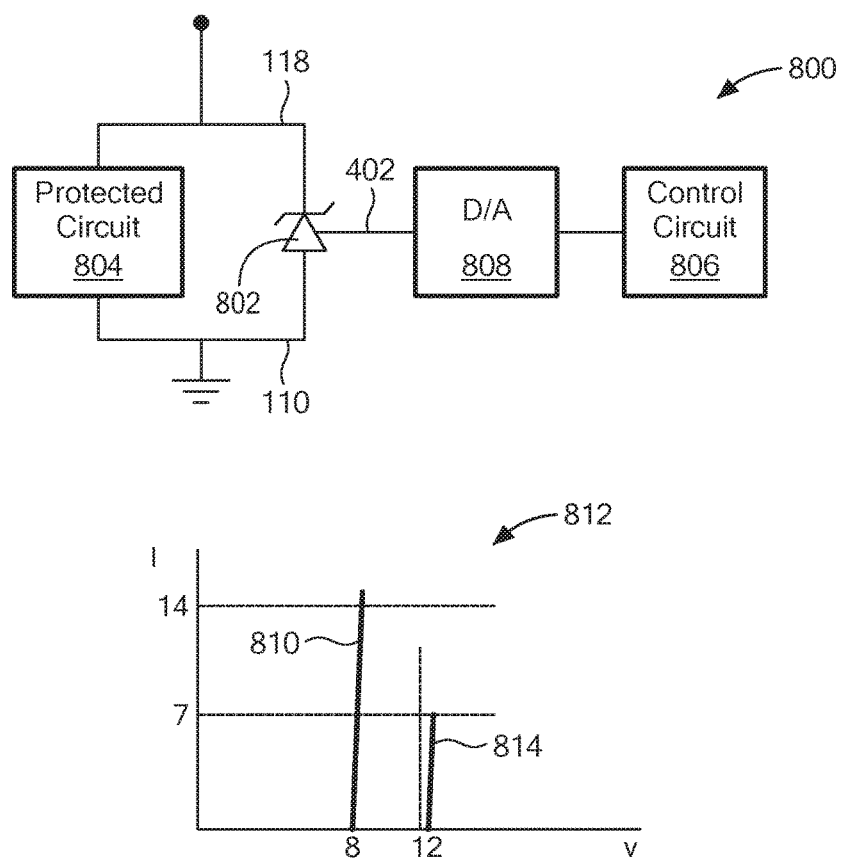
FIG. 8 is a circuit diagram of a circuit utilizing a Zener diode with an adjustable reverse breakdown voltage and corresponding IV curve.

Referring to FIG. 8, circuit 800 is an electrical overstress protection circuit that includes a Zener diode 802 with an adjustable reverse breakdown voltage. Zener diode 802 may be the same as or similar to electronic device 400, and may include anode terminal 110, cathode terminal 118, and field plate terminal 402.

Zener diode 802 may act as a protection circuit to reduce the chance that protected circuit 804 becomes damaged by an electrical overstress condition, such as an electro-static discharge ("ESD") event, an overcurrent event, or the like. In the case of electrical overstress event, current may flow through Zener diode 802 rather than through protected circuit 804.

Circuit 800 may also include a control circuit 806 coupled to DAC 808. The output of DAC 808 may be coupled to field plate terminal 402 to control the reverse breakdown voltage of Zener diode 802. The output of control circuit 806 may, for example, cause DAC 808 to provide a desired voltage to terminal 402 to control the reverse breakdown voltage of Zener diode 802. Control circuit 806 may include various circuits and/or circuit elements that can implement a function to control the reverse breakdown voltage.

In one example, Zener diode 802 may be used for testing an integrated circuit. In an embodiment, circuit 800 may be an integrated circuit supported by a semiconductor substrate and enclosed in a chip package. During normal operation, control circuit 806 may provide a nominal voltage to terminal 402 so that Zener diode 802 acts as an electrical overstress protection circuit. In embodiments, the nominal voltage may provide a reverse breakdown voltage of 8V, as shown by line 810 in IV curve 812.

In embodiments, when the circuit is placed in test mode, control circuit 806 may increase the voltage applied to terminal 402, thus increasing the value reverse breakdown voltage to 12V, as shown by line 814 in IV curve 812. Increasing the value of the reverse breakdown voltage for tests such as a short overvoltage ("SHOVE") test (e.g. a test to identify potentially weak CMOS gates in an integrated circuit), a burn-in test, or a Load Dump test, for example, may avoid false activation of the electrical overstress protection circuit, and false failures of the test. In embodiments, Zener diode 802 may be replaced by an electrical overstress protection circuit, such as an ESD clamp circuit, that utilizes a Zener diode with an adjustable reverse breakdown voltage.

In some applications, design specifications may require the VCC pin of an automotive circuit to withstand 10 kV of electrostatic discharge and trigger an overvoltage condition at approximately 42 Volts under operation. In such a circuit, Zener diode 802 may be designed to have a breakdown voltage of 42 Volts during normal operation. However, it may be desirable to reduce the breakdown voltage of Zener diode 802 to 30 Volts, for example, in the case of an ESD event. If an ESD event is detected, control circuit 806 may reduce the breakdown voltage of Zener diode 802 (or an ESD clamp circuit that utilizes Zener diode 802) to 30 Volts. The ESD event may be detected by any number of ways known in the art including, but not limited to, a comparator that compares voltage across the terminals to a predetermined threshold, a shunt resistor or current meter to measure current through the Zener diode, etc.

Reducing the breakdown voltage of Zener diode 802 may allow current to pass through Zener diode 802 during an ESD event, but also block current from flowing through Zener diode 802 during an overvoltage condition up to 42 Volts during normal operation when the VCC voltage is below the overvoltage threshold of 42 volts.

Figure 9:
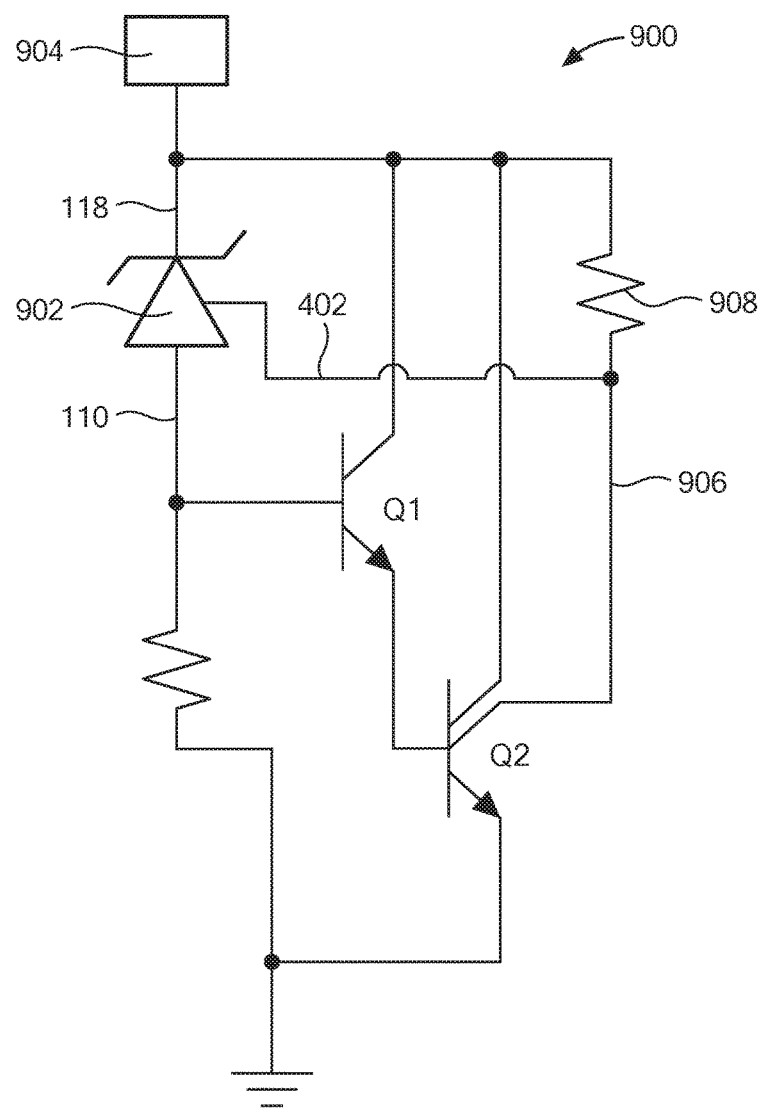
FIG. 9 is a circuit diagram of an electrostatic discharge ("ESD") protection circuit utilizing a Zener diode with an adjustable reverse breakdown voltage.

Referring to FIG. 9, circuit 900 may be an ESD clamp circuit that utilizes a Zener diode 902 with an adjustable reverse breakdown voltage. Zener diode 902 may be the same as or similar to electronic device 400, having cathode terminal 118, anode terminal 110, and field plate terminal 402.

ESD clamp circuit 900 may include NPN BJT transistors Q1 and Q2 arranged in a Darlington array formation to produce a so-called Darlington ESD clamp circuit. If the voltage at terminal 904 exceeds the reverse breakdown voltage of Zener diode 902, current will flow through Zener diode 902 into the base of transistor Q1. Subsequently, transistor Q1 will drive current into the base of transistor Q2 turning transistor Q2 on, allowing current to flow from terminal 904, through Q2, to ground.

Field plate terminal 402 may be coupled to collector terminal 906 of transistor Q2. As current begins to flow through transistor Q2 and resistor 908, the voltage at field plate terminal 402 will change, thus changing the reverse breakdown voltage of Zener diode 902 during operation of ESD clamp circuit 900. In embodiments, this may result in an ESD clamp with a so-called S characteristic of its IV curve.

Figure 10:
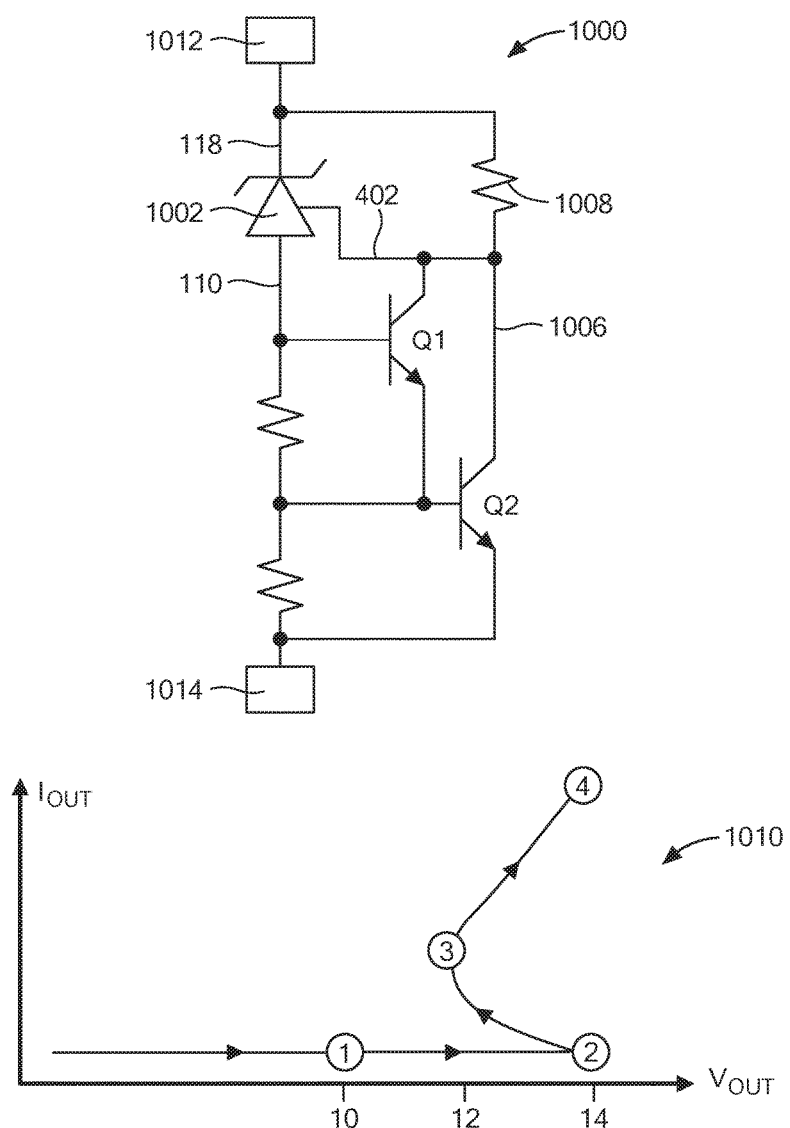
FIG. 10 is a circuit diagram of another embodiment of an ESD protection circuit utilizing a Zener diode with an adjustable reverse breakdown voltage and corresponding IV curve.

Turning to FIG. 10, circuit 1000 is another embodiment of an ESD clamp circuit utilizing a Zener diode 1002 with an adjustable reverse breakdown voltage. Zener diode 1002 may be the same as or similar to electronic device 400, having cathode terminal 118, anode terminal 110, and field plate terminal 402.

Field plate terminal 402 may be coupled to collector terminal 1006 of transistor Q2. Similar to circuit 900, as current begins to flow through transistor Q2 and resistor 1008, the voltage at field plate terminal 402 will change, thus changing the reverse breakdown voltage of Zener diode 1002 during operation of ESD clamp circuit 1000.

Graph 1010 is an IV curve that illustrates the S characteristic of ESD clamp circuit 1000. The S characteristic is so named based on the S-like shape of the IV curve over time. Points 1 through 4 on IV curve 1010 represent the progression of the IV characteristic over time during an electrical overstress event.

When ESD clamp 1000 is in a stable state, with no current flowing, the breakdown voltage of Zener diode 1002 may be about 14 Volts. As the voltage between terminals 1012 and 1014 increases to the Zener diode's breakdown voltage (shown by point 2 in graph 1010), current may start to flow through Zener diode 1002 and place transistors Q1 and Q2 in conducting states. As current begins to flow through resistor 1008, the voltage at field plate terminal 402 may decrease with respect to the voltage at cathode terminal 118, thus reducing the value of the breakdown voltage of Zener diode 1002, as shown by point 3 in graph 1010. As current continues to increase through Q2, the breakdown voltage may increase linearly as shown by the curve between points 3 and 4.

Figure 11:
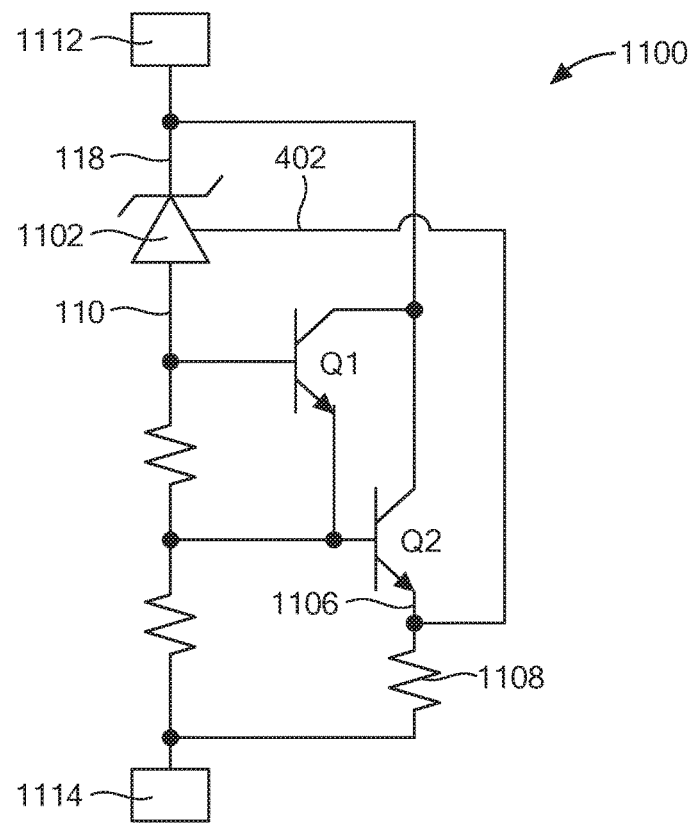
FIG. 11 is a circuit diagram of another embodiment of an ESD protection circuit utilizing a Zener diode with an adjustable reverse breakdown voltage and corresponding IV curve.
Figure 11:
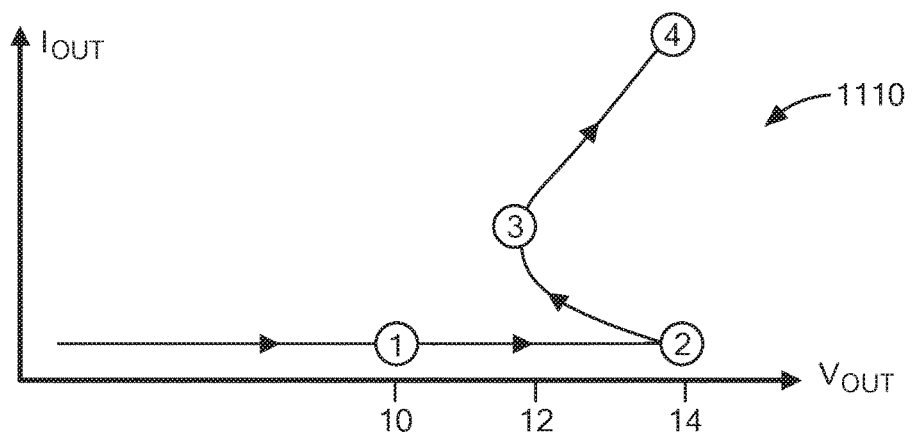

Turning to FIG. 11, circuit 1100 is another embodiment of an ESD clamp circuit utilizing a Zener diode 1102 with an adjustable reverse breakdown voltage. Zener diode 1102 may be the same as or similar to electronic device 400, having cathode terminal 118, anode terminal 110, and field plate terminal 402. However, Zener diode 1102 may have reverse doping polarity with respect to electronic device 400. For example, the p-doped areas in electronic device 400 may be replaced by n-doped areas in Zener diode 1102, and the n-doped areas in electronic device 400 may be replaced by p-doped areas in Zener diode 1102.

In circuit 1100, field plate terminal 402 may be coupled to emitter terminal 1106 of transistor Q2. Similar to circuits 900 and 1000, as current begins to flow through transistor Q2 and resistor 1108, the voltage at field plate terminal 402 will change, thus changing the reverse breakdown voltage of Zener diode 1102 during operation of ESD clamp circuit 1100.

Graph 1110 is an IV curve that illustrates the S characteristic of ESD clamp circuit 1100. Points 1 through 4 on IV curve 1110 represent the progression of the IV characteristic over time during an electrical overstress event.

When ESD clamp 1100 is in a stable state, with no current flowing, the breakdown voltage of Zener diode 1102 may be about 14 Volts. As the voltage between terminals 1112 and 1114 increases to the Zener diode's breakdown voltage (shown by point 2 in graph 1110), current may start to flow through Zener diode 1102 and place transistors Q1 and Q2 in conducting states. As current begins to flow through resistor 1108, the voltage at field plate terminal 402 may decrease with respect to the voltage at cathode terminal 118, thus reducing the value of the breakdown voltage of Zener diode 1102, as shown by point 3 in graph 1110. As current continues to increase through Q2, the breakdown voltage may increase linearly as shown by the curve between points 3 and 4.

Figure 12:
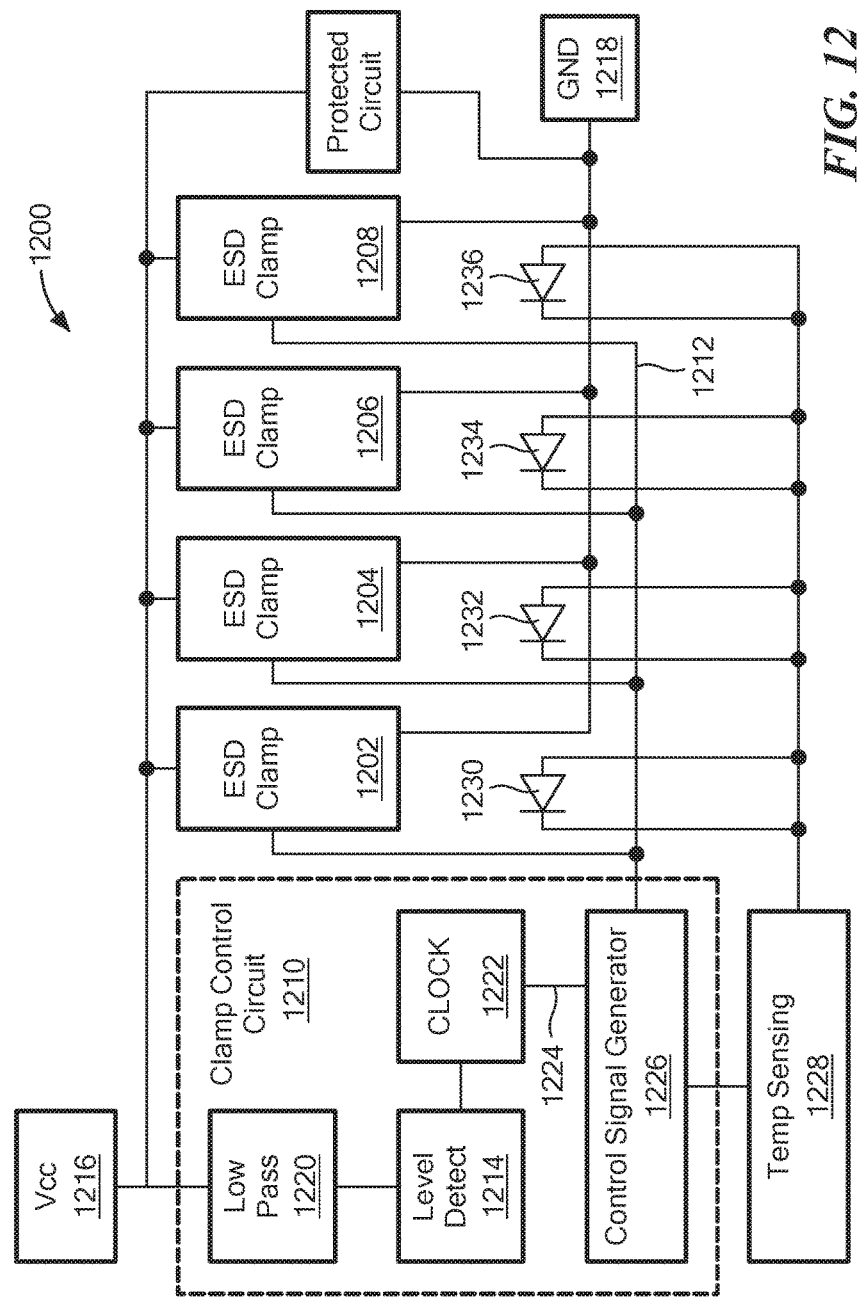
FIG. 12 is a circuit diagram of a circuit having multiple ESD protection circuits utilizing a Zener diodes with adjustable reverse breakdown voltages.

Referring to FIG. 12, circuit 1200 may be an electrical overstress protection circuit having a plurality of ESD clamp circuits 1202-1208 and a clamp control circuit 1210. ESD clamp circuit 1202-1208 may be similar to ESD clamp circuits 900, 1000, 1100, and/or 1200 described above. For example, each ESD clamp circuit 1202-1208 may be an adjustable Zener diode protection circuit, a Darlington array incorporating an adjustable Zener diode, or any other type of ESD clamp circuit that may utilize an adjustable Zener diode.

In particular, each clamp circuit 1202-1208 may incorporate a Zener diode with an adjustable reverse breakdown voltage. However, the field plate terminal (i.e. the terminal that controls the reverse breakdown voltage) of each ESD circuit 1202-1208 may be coupled to clamp control circuit 1210, as shown by bus line 1212. Accordingly, clamp control circuit 1210 may control the reverse breakdown voltage (and thus the voltage at which each clamp circuit will conduct current) for each of the ESD clamp circuits 1202-1208.

Clamp control circuit 1210 may be configured to selectively adjust the reverse breakdown voltage of ESD clamp circuits 1202-1208. Clamp control circuit 1210 may include a level detect circuit 1214 that senses an overvoltage condition. For example, level detect circuit 1214 may sense the voltage between terminal 1216 and terminal 1218 to determine if it exceeds a predetermined threshold indicating an overvoltage condition. Level detect circuit 1214 may include a comparator or other circuitry to detect whether the voltage (or current) between terminals 1216 and 1218 exceeds a particular threshold voltage (or current). Clamp control circuit 1210 may also include a low pass filter 1220 coupled to level detect circuit 1214. Low pass filter 1220 may block high-frequency noise on the voltage signal at terminal 1216 in order to reduce the chance that noise on the voltage signal will cause clamp control circuit 1220 to erroneously detect an overvoltage condition.

Clamp control circuit 1210 may also include a clock circuit 1222 and control signal generator circuit 1226. Clock circuit 1222 may provide a clock signal 1224 to control signal generator circuit 1226. When control signal generator circuit 1226 receives clock signal 1224, control signal generator circuit 1226 may drive individual signal lines of bus 1212 high and low to selectively adjust the breakdown voltages of ESD clamp circuits 1202-1208. In the embodiment shown, clamp circuit 1210 may control the breakdown voltages of ESD clamp circuits 1202-1208 by turning clock circuit 1222 on or off. When clock circuit 1222 is on, control signal generator circuit 1226 drives bus 1212 with analog signals to control the breakdown voltages of ESD clamp circuits 1202-1208. When clock circuit 1222 is off, control signal generator circuit 1226 may not drive bus 1212.

In other embodiments, clock 1222 and control signal generator circuit 1226 may be replaced by any circuit or processor that can drive bus 1212 with analog, digital, or switched signals to control the breakdown voltages of ESD clamp circuits 1202-1208. Such circuits may include a processor executing software or firmware, a shift register, a pattern generator, analog-to-digital converter, etc.

Circuit 1200 may also include a temperature sensing circuit 1228 configured to measure the temperature of ESD protection circuit 1202-1208. Temperature sensing circuit 1228 may be coupled to temperature sensors 1230-1236, which may be positioned near a respective ESD protection circuit 1202-1208. In an embodiment, temperature sensors 1230-1236 are diodes having temperature dependencies. Temperature sensing circuit 1228 may measure the current through the respective diodes to determine the temperature at or near a respective ESD protection circuits 1202-1208.

In operation, level detect circuit 1214 may detect whether an electrical overstress condition is present between terminals 1216 and 1218 by, for example, comparing the voltage between those terminals to a predetermined threshold voltage. If an overvoltage condition exists, level detect circuit 1214 may activate clock 1222 which, in turn, may activate control signal generator circuit 1226. Control signal generator circuit 1226 may selectively adjust the breakdown voltage of ESD protection circuit 1202-1208 so that one or more of ESD protection circuits 1202-1208 will conduct current between terminals 1216 and 1218 in response to the detected overvoltage condition. Control signal generator circuit 1226 may also selectively adjust the breakdown voltage of ESD protection circuit 1202-1208 to control the amount of current flowing through each ESD protection circuit 1202-1208.

In an embodiment, temperature sensing circuit 1228 may measure the temperature of each ESD protection circuit 1202-1208 (by, for example, measuring the current through temperature sensing diodes 1230-1236) and transmit the measured temperature to clamp control circuit 1210. If the measured temperature of any of the ESD protection circuit 1202-1208 is too high (e.g. if the measured temperature exceeds a predetermined threshold or tolerance), clamp control circuit 1210 may adjust the breakdown voltage of that particular ESD protection circuit to turn the ESD protection circuit off or limit the amount of current flowing through the ESD protection circuit.

Various clamp control circuits may be used in place of clamp control circuit 1210 to adjust the breakdown voltages of ESD protection circuit 1202-1208 in response to various conditions. Examples may be found in U.S. patent application Ser. No. 15/272,784 (filed Sep. 22, 2016). Some of the clamp control circuits in U.S. patent application Ser. No. 15/272,784 may be configured to turn ESD protection circuits on and off. However, they may be modified to similarly adjust a breakdown voltage of an ESD protection circuit like circuit 1200 above.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited in this disclosure are incorporated here by reference in their entirety.

The invention claimed is:

1. An apparatus comprising:
   a substrate;
   a first doped region of the semiconductor substrate having a p doping type;
   a second doped region adjacent to the first doped region of the semiconductor substrate having an n doping type, wherein an interface between the first and second doped regions forms a p-n junction;
   a circuit element placed in spaced relation to the p-n junction, the circuit element configured to produce an electric field that interacts with the p-n junction to change a reverse breakdown voltage of the p-n junction, wherein the circuit element comprises a field plate positioned in spaced relationship to the p-n junction to produce the electric field; and;

a biasing circuit that produces a voltage on the field plate, which produces the electric field that interacts with the p-n junction to change the reverse breakdown voltage of the p-n junction, wherein the biasing circuit is configured to produce an adjustable voltage on the field plate, wherein adjusting the voltage consequently changes the value of the reverse breakdown voltage.

2. The apparatus of claim 1 wherein the first doped region and the second doped region form a Zener diode or an avalanche diode.

3. The apparatus of claim 2 wherein the circuit element generates an electric field that changes a value of the reverse breakdown voltage.

4. The apparatus of claim 1 wherein the biasing circuit comprises one or more of: an active circuit element and a passive circuit element.

5. The apparatus of claim 1 wherein the biasing circuit is configured to adjust the adjustable voltage in response to a received stimulus.

6. The apparatus of claim 5 further comprising an ESD detection circuit coupled to the biasing circuit, wherein the received stimulus is a signal produced by the ESD detection circuit in response to detection of an ESD event.

7. An apparatus comprising:
a substrate;
a Zener diode formed in the substrate with an adjustable reverse breakdown voltage, the Zener diode comprising:
    a first doped region of the substrate having a first doping type;
    a second doped region having a second doping type positioned adjacent to the first doped region of the substrate, wherein an interface between the first and second doped regions forms a p-n junction; and
    a field plate placed in spaced relation to the p-n junction, the field plate configured to produce an electric field that interacts with the p-n junction to change a reverse breakdown voltage of the p-n junction; and
a biasing circuit to generate a voltage on the field plate to generate the electric field;
wherein the biasing circuit is configured to generate an adjustable voltage.

8. An ESD protection circuit comprising:
a first terminal;
a second terminal;
an adjustable Zener diode coupled in series between the first and second terminals, the adjustable Zener diode having an anode, a cathode, and a control input node, wherein a voltage applied to the control input node alters a reverse breakdown voltage of the Zener diode; and
an ESD detection circuit coupled to the control input node and configured to generate the voltage applied to the control input node in response to detection of an ESD event, wherein the ESD detection circuit comprises one or more switches to selectively couple and/or decouple the control input node from a ground node.

9. The ESD protection circuit of claim 8 wherein the ESD protection circuit comprises a substrate and the adjustable Zener diode comprises:
    a first doped region of the substrate having a p doping type;
    a second doped region having an n doping type positioned adjacent to the first doped region of the substrate, wherein an interface between the first and second doped regions forms a p-n junction; and
    a field plate placed in spaced relation to the p-n junction, the field plate configured to produce an electric field that interacts with the p-n junction to change a reverse breakdown voltage of the p-n junction;
    wherein the field plate is coupled to the control input node to receive the voltage applied to the control input node.

10. An apparatus comprising:
a first terminal;
a second terminal;
one or more conduction path circuits coupled between the first and second terminals, each conduction path circuit comprising a Zener diode with an adjustable reverse breakdown voltage, each Zener diode comprising a control input node to receive an analog voltage that controls the adjustable reverse breakdown voltage;
    wherein the conduction path circuit includes an input terminal to receive an enable signal which, when activated, allows the conduction path circuit to conduct electrical current between the first and second terminals; and
a control circuit coupled to the control input nodes of the Zener diodes of the one or more conduction path circuits, the control circuit configured to generate the analog voltage and selectively control the adjustable reverse breakdown voltage of the Zener diodes to control current flow through the one or more conduction path circuits.

11. The apparatus of claim 10 wherein the control circuit further comprises one or more digital-to-analog converters to produce the analog voltage.

12. The apparatus of claim 10 further comprising one or more temperature sensors to detect a temperature of a respective conduction path circuit and provide a temperature signal to the control circuit.

13. The apparatus of claim 12 wherein the control circuit selectively controls the adjustable reverse breakdown voltage of the Zener diodes in response to the temperature signals.

14. The apparatus of claim 10 wherein each Zener diode further comprises:
    a first doped region of a substrate having a p doping type;
    a second doped region having an n doping type positioned adjacent to the first doped region of the substrate, wherein an interface between the first and second doped regions forms a p-n junction; and
    a field plate placed in spaced relation to the p-n junction, the field plate configured to produce an electric field that interacts with the p-n junction to change a reverse breakdown voltage of the p-n junction;
    wherein the field plate is coupled to the control input node to receive the analog voltage.

* * * * *

UNITED STATES PATENT AND TRADEMARK OFFICE
CERTIFICATE OF CORRECTION

PATENT NO. : 10,056,364 B1
APPLICATION NO. : 15/481882
DATED : August 21, 2018
INVENTOR(S) : Maxim Klebanov et al.

Page 1 of 1

It is certified that error appears in the above-identified patent and that said Letters Patent is hereby corrected as shown below:

Column 1, Line 6, replace "device" with --devices--

Column 1, Line 7, replace "device" with --devices--

Column 3, Line 40, remove the "a"

Column 5, Line 37, replace "device 110'" with --device 100--

Column 5, Line 55, replace "110" with --100--

Column 6, Line 6, remove the word "as"

Column 9, Line 8, replace "clamp circuit" with --protection circuits--

Column 9, Line 40, replace "1220" with --1210--

Column 10, Line 50, replace "that that" with --that the--

Signed and Sealed this
Twenty-seventh Day of November, 2018

Andrei Iancu
*Director of the United States Patent and Trademark Office*